(12) United States Patent
Choi et al.

(10) Patent No.: US 7,985,961 B2
(45) Date of Patent: Jul. 26, 2011

(54) RESISTIVE RANDOM ACCESS MEMORY DEVICE

(75) Inventors: Sang-jun Choi, Yongin-si (KR);
Jung-hyun Lee, Yongin-si (KR);
Chang-soo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 334 days.

(21) Appl. No.: 12/003,133

(22) Filed: Dec. 20, 2007

(65) Prior Publication Data

US 2008/0170427 A1 Jul. 17, 2008

(30) Foreign Application Priority Data

Jan. 12, 2007 (KR) ........................ 10-2007-0003966

(51) Int. Cl.
*H01L 47/00* (2006.01)
(52) U.S. Cl. .................... 257/4; 257/467; 257/E31.029; 365/148
(58) Field of Classification Search .................... 338/13, 338/20; 257/2, 4, 379, 528, 536, 537, 577, 257/E21.006, E27.016, E29.28, E31.029, 257/42, 467; 365/148
See application file for complete search history.

(56) References Cited

U.S. PATENT DOCUMENTS

| | | | |
|---|---|---|---|
| 6,992,369 B2 * | 1/2006 | Kostylev et al. | 257/537 |
| 7,635,855 B2 * | 12/2009 | Chen et al. | 257/4 |
| 2005/0174861 A1 * | 8/2005 | Kim et al. | 365/200 |
| 2005/0250281 A1 * | 11/2005 | Ufert et al. | 438/257 |
| 2006/0077706 A1 * | 4/2006 | Li et al. | 365/163 |
| 2006/0284214 A1 * | 12/2006 | Chen | 257/213 |
| 2008/0023685 A1 * | 1/2008 | Czubatyj et al. | 257/2 |
| 2008/0135824 A1 * | 6/2008 | Lai et al. | 257/2 |
| 2010/0187492 A1 * | 7/2010 | Lee | 257/3 |

* cited by examiner

*Primary Examiner* — Matthew C Landau
*Assistant Examiner* — Joseph C Nicely
(74) *Attorney, Agent, or Firm* — Harness, Dickey & Pierce, P.L.C.

(57) ABSTRACT

Example embodiments may provide resistive random access memory devices and/or methods of manufacturing resistive random access memory devices. Example embodiment resistive random access memory devices may include a switching device and/or a storage node connected to the switching device. The storage node may include a stack structure including a plurality of resistance change layers separated from one another and first and second electrodes each on a side wall of the stack structure. The resistance change layers may be connected to the first and the second electrodes in parallel and/or may have different switching voltages from each other.

7 Claims, 10 Drawing Sheets

RESISTIVE RANDOM ACCESS MEMORY DEVICE

PRIORITY STATEMENT

This application claims priority under §119 to Korean Patent Application No. 10-2007-0003966, filed on Jan. 12, 2007, in the Korean Intellectual Property Office, the entire disclosure of which is incorporated herein by reference.

BACKGROUND

1. Field

Example embodiments relate to semiconductor memory devices, for example, to resistive random access memory devices and/or example methods of manufacturing the same.

2. Description of the Related Art

Related art resistive random access memory (RRAM) may use a resistance change material, such as a transition metal oxide, with a resistance that may change according to applied voltage. If a voltage equal to or higher than a set voltage is applied to a resistance change material, resistance of a resistance change material may decrease, and this state may be referred to as an ON state. If a voltage equal to or higher than a reset voltage is applied to a resistance change material, the resistance of the resistance change material may increase, and this state may be called an OFF state.

Related art RRAMs may have an operating speed that is about $10^5$ times faster than flash memories and may have other advantages such as being capable of lower voltage driving. Related art RRAMs may allow for more than about $10^{10}$ instances of repetitive writing and/or erasing, and thus may be expected to be used in many apparatuses that may require a storage unit.

Related art RRAMs may store a 0 or 1 in a unit cell, and may not store multi-bit data. Integration of related art RRAMs may not increase by the use of multi-bit data.

SUMMARY

The inventors have identified that problems of related art RRAMs may involve a lack of a multi-bit characteristic, and example embodiments may provide resistive random access memory devices having a multi-bit characteristic.

Example methods of manufacturing resistive random access memory devices may also be provided.

Example embodiments may provide a resistive random access memory device including a switching device and/or a storage node connected to the switching device. The storage node may include a stack structure having a plurality of resistance change layers separated from one another and/or a first electrode and a second electrode each formed on both side walls of the stack structure. Resistance change layers may be connected to the first and the second electrodes in parallel.

The resistance change layers may have different switching voltages from each other.

An insulation layer may be between adjacent resistance change layers.

One of the resistance change layers may be, for example, a $Cu_{2-x}S$ layer and/or a Ge—Te layer.

One of the resistance change layers may be, for example, a $Cu_{2-x}S$ layer and a different resistance change layer may be, for example, a Ge—Te layer.

The first electrode may include a first region covering a side wall of the stack structure and/or a second region extending out from the stack structure.

The switching device may be connected to the second region of the first electrode.

The second electrode may include a third region covering a side wall of the stack structure and/or a fourth region extending out from the stack structure.

Example methods of manufacturing resistive random access memory devices may include providing a substrate on which a switching device may be present, forming an interlayer insulation layer on the substrate to cover the switching device, forming a contact hole in the interlayer insulation layer to expose the switching device, forming a conductive plug in the contact hole, forming a stack structure having a plurality of resistance change layers separated from one another on the interlayer insulation layer adjacent to the conductive plug, forming a first electrode covering one side wall of the stack structure and connecting the side wall to the conductive plug, and/or forming a second electrode on the other side wall of the stack structure on the interlayer insulation layer. Resistance change layers may be connected to the first and the second electrodes in parallel.

The resistance change layers may have different switching voltages from each other.

An insulation layer may be between the adjacent resistance change layers.

One of the resistance change layers may be formed of, for example, $Cu_{2-x}S$ and another resistance change layer may be formed of, for example Ge—Te.

The second electrode may extend out from the stack structure.

Forming of the first and second electrodes may include forming an electrode layer covering the conductive plug and/or stack structure on the interlayer insulation layer, forming a mask layer crossing the stack structure and/or extending out from both sides of the stack structure to cover the conductive plug on the electrode layer, removing the electrode layer around the mask layer, removing the mask layer and the electrode layer, which may be formed on the stack structure, and/or removing the mask layer around the stack structure.

Example embodiments may provide resistive random access memory devices having a multi-bit characteristic and/or increased integration.

BRIEF DESCRIPTION OF THE DRAWINGS

The above and/or other features and advantages of example embodiments will become more apparent by describing in detail the attached drawings in which.

DETAILED DESCRIPTION

Various example embodiments will now be described more fully with reference to the accompanying drawings in which some example embodiments are shown. In the drawings, the thicknesses of layers and regions are exaggerated for clarity.

Detailed illustrative embodiments of the claims are disclosed herein. However, specific structural and functional details disclosed herein are merely representative for purposes of describing example embodiments. The claims may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the claims. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
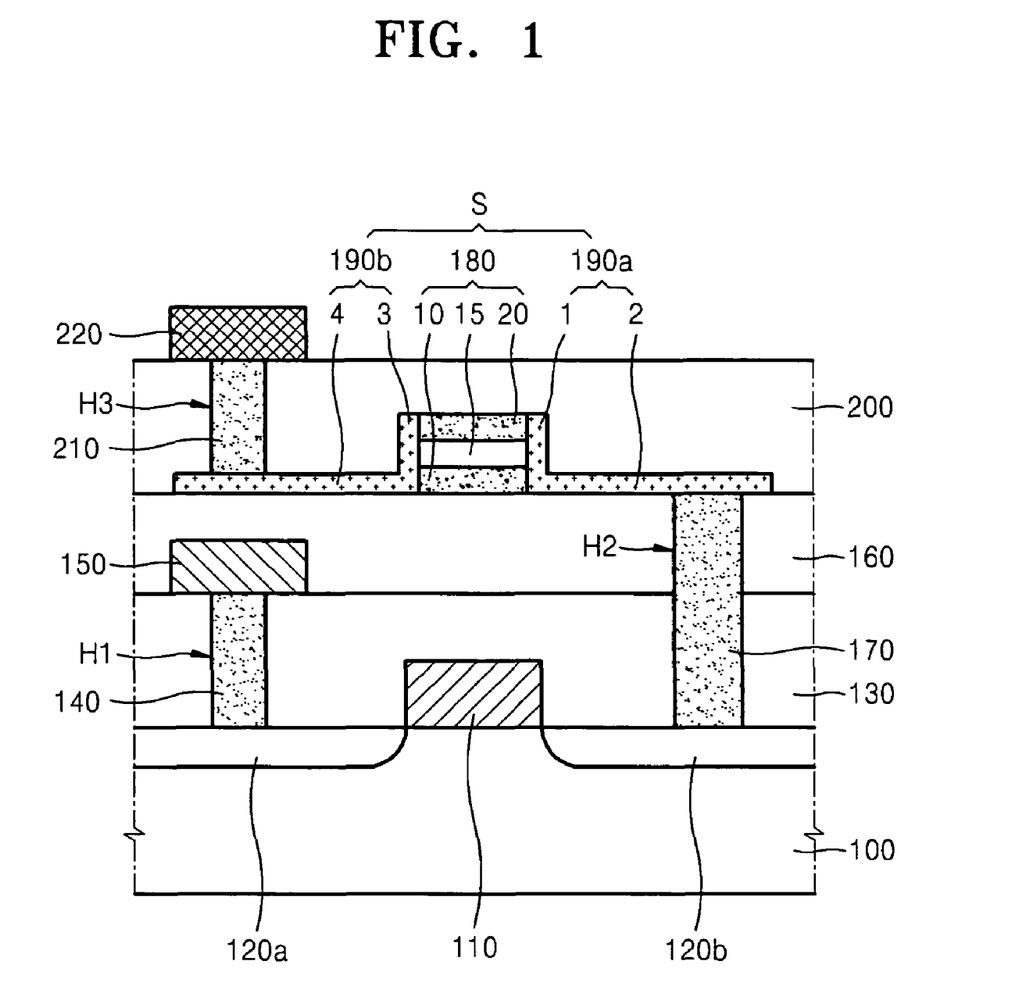
FIG. 1 is a cross-sectional view illustrating an example embodiment resistive random access memory device.

FIG. 1 illustrates an example embodiment resistive random access memory device (RRAM).

As shown in FIG. 1, a gate 110 may be on a substrate 100, and first and second impurity regions 120a and 120b may be in the substrate 100 on sides of the gate 110. One of the first and the second impurity regions 120a and 120b may be a source and the other may be a drain. The gate 110 and the first and the second impurity regions 120a and 120b may form a transistor. A first interlayer insulation layer 130 covering the transistor may be on the substrate 100. A first contact hole H1 may be in the first interlayer insulation layer 130 and expose the first impurity region 120a and may be filled with a first conductive plug 140. A bit line 150 covering the exposed portion of the first conductive plug 140 may be on the first interlayer insulation layer 130. A second interlayer insulation layer 160 may be on the first interlayer insulation layer 130 and may cover the bit line 150. A second contact hole H2 may be in the first and the second interlayer insulation layers 130 and 160 and may expose the second impurity region 120b. Second contact hole H2 may be filled with a second conductive plug 170.

A stack structure 180 may be formed on the second interlayer insulation layer 160 adjacent to the second conductive plug 170. The stack structure 180 may include a plurality of resistance change layers with unique switching voltages. Insulation layers may be between adjacent resistance change layers. For example, the stack structure 180 may be a structure in which a first resistance change layer 10, an insulation layer 15, and a second resistance change layer 20 may be sequentially stacked. The first resistance change layer 10 may be a $Cu_{2-x}S$ layer, and/or the second resistance change layer 20 may be a Ge—Te layer. The stack structure 180 may further include another insulation layer (not shown) on the second resistance change layer 20. The stack structure 180 may have a hexahedron shape. A first electrode 190a and/or a second electrode 190b may be on both sidewalls of the stack structure 180. The first electrode 190a may have an "L" shape and may be connected to the second conductive plug 170. The second electrode 190b may be symmetrical to the first electrode 190a. The first electrode 190a may include a first region 1 that may cover one of the sidewalls of the stack structure 180 and/or a second region 2, which may be on the lower portion of the first region 1 and substantially perpendicular to the first region 1. Similarly, the second electrode 190b may include a third region 3 that may cover the other sidewall of the stack structure 180 and/or a fourth region 4 substantially perpendicular to the third region 3. The stack structure 180, the first electrode 190a, and/or the second electrode 190b may form a storage node S.

A third interlayer insulation layer 200 may cover the storage node S on the second interlayer insulation layer 160. A third contact hole H3 may be in the third interlayer insulation layer 200 and may expose the second electrode 190b. The third contact hole H3 may be filled with a third conductive plug 210. A wiring 220 covering the exposed portion of the third conductive plug 210 may be on the third interlayer insulation layer 200.

A voltage may be applied between the first and the second electrodes 190a and 190b if a voltage is applied to each of the bit line 150 and the wiring 220 after the formation of a channel under the gate 110 by applying a voltage higher than a threshold voltage to the gate 110. The resistances of the first and the second resistance change layers 10 and 20 may change according to the voltage applied between the first and the second electrodes 190a and 190b.

Figure 2A:
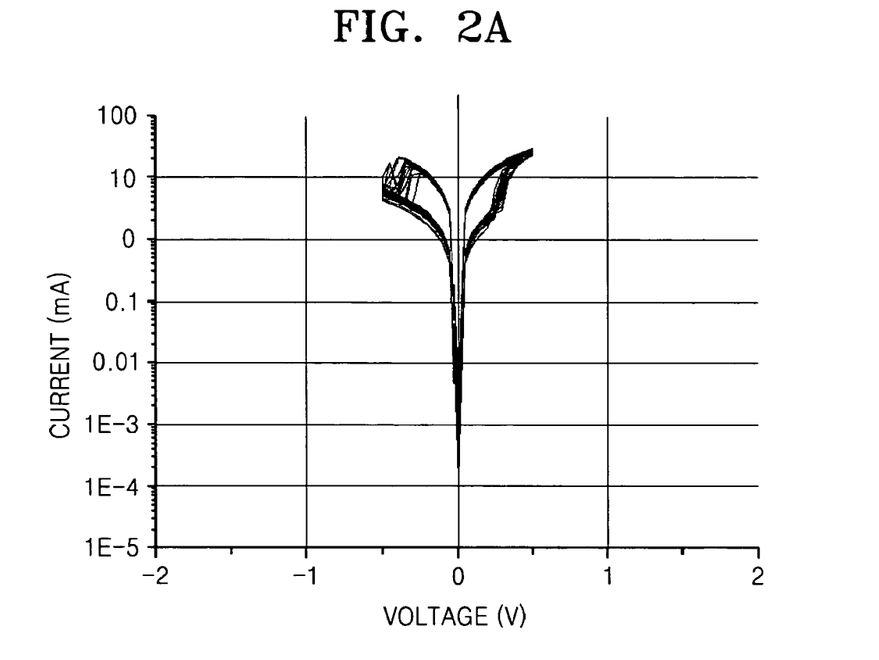
FIGS. 2A and 2B are graphs showing current-voltage characteristics of a $Cu_{2-x}S$ layer and a Ge—Te layer.
Figure 2B:
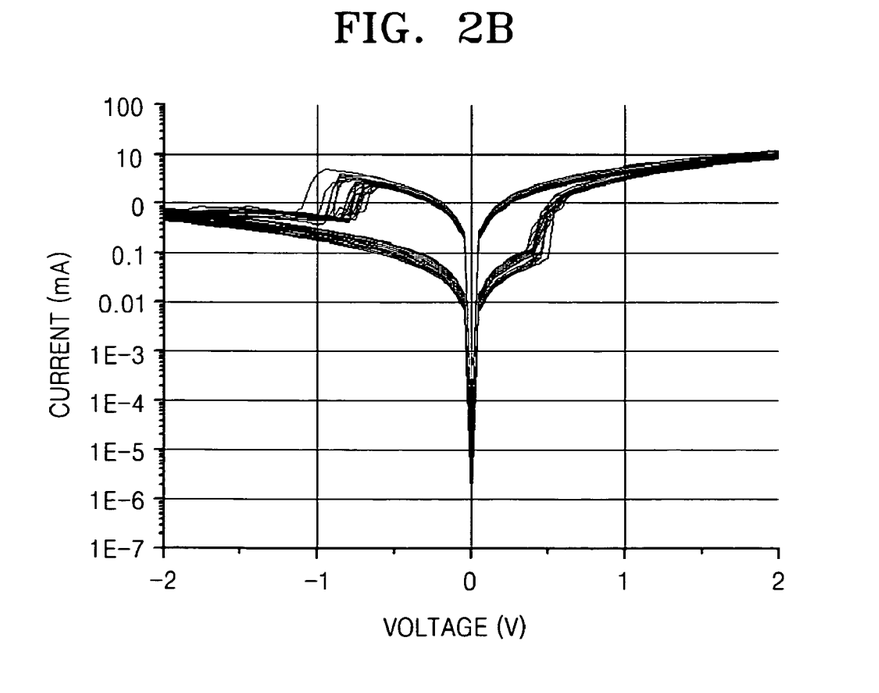

FIGS. 2A and 2B are graphs showing current-voltage characteristics of a $Cu_{2-x}S$ layer (thickness of about 200 Å) and Ge—Te layer (thickness of about 300 Å), respectively.

As shown in FIG. 2A, resistance of the $Cu_{2-x}S$ layer changes at about 0.25V and about −0.4V. A set voltage and a reset voltage of the $Cu_{2-x}S$ layer may be about 0.25V and about −0.4V, respectively.

As shown in FIG. 2B, a set voltage and a reset voltage of the Ge—Te layer may be about 0.5V and about −0.8V, respectively.

A difference between the set voltages of the $Cu_{2-x}S$ layer and the Ge—Te layer may be about 0.25V, and a difference between the reset voltages of the $Cu_{2-x}S$ layer and the Ge—Te layer may be about 0.4V.

The stack structure 180 of FIG. 1, having the first resistance change layer 10 formed of $Cu_{2-x}S$ and the second resistance change layer 20 formed of Ge—Te, may have four resistive statuses distinguishable from each other according to the voltages applied thereto. This may mean that an example embodiment RRAM including the stack structure 180 may have a multi-bit characteristic.

Figure 3:
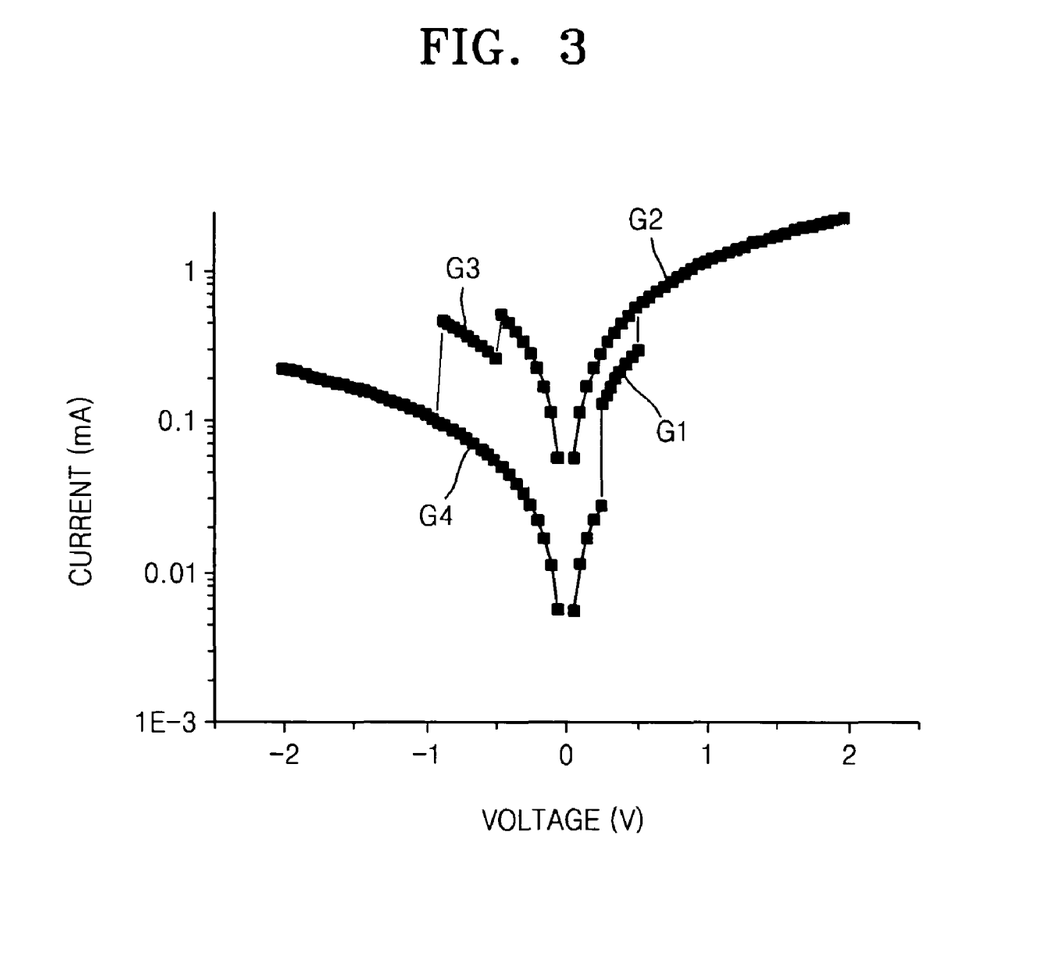
FIG. 3 is a graph of a current-voltage characteristic of the stack structure of FIG. 1 having a first resistance change layer formed of $Cu_{2-x}S$ and/or a second resistance change layer formed of Ge—Te.

FIG. 3 is a graph of a simulation of a current-voltage characteristic of the stack structure 180 of FIG. 1 having the first resistance change layer 10 formed of $Cu_{2-x}S$ and the second resistance change layer 20 formed of Ge—Te.

As shown in FIGS. 1 and 3, the stack structure 180 may have first through fourth resistive statuses according to the voltages applied thereto. The first through the fourth resistive statuses are explained in detail below.

First, if a voltage higher than the set voltage of the first resistance change layer 10 and lower than the set voltage of the second resistance change layer 20 is applied to the stack structure 180, the stack structure 180 may be in a first state. In the first state, the first resistance change layer 10 may be in a lower resistive state and the second resistance change layer 20 may be in a higher resistive state. In the first state, the current-voltage characteristic of the stack structure 180 may correspond to a first trend G1. The first state may correspond to datum (1, 0).

Second, if a voltage higher than the set voltage of the second resistance change layer 20 is applied to the stack structure 180, the stack structure 180 may be in a second state. In the second state, the first and second resistance change layer 10 and 20 may both be in lower resistive states. In the second state, the current-voltage characteristic of the stack structure 180 may correspond to a second trend G2. The second state may correspond to datum (1, 1).

Third, if a voltage higher than the reset voltage of the second resistance change layer 20 and lower than the reset voltage of the first resistance change layer 10 is applied to the stack structure 180, the stack structure 180 may be in a third state. In the third state, the first resistance layer 10 may be in a higher resistive state and the second resistance layer 20 may be in a lower resistive state. In the third state, the current-voltage characteristic of the stack structure 180 may correspond to a third trend G3. The third state may correspond to datum (0, 1).

Fourth, if a voltage lower than the reset voltage of the second resistance change layer 20 is applied to the stack structure 180, the stack structure 180 may be in a fourth state. In the fourth state, the first and the second resistance change layers 10 and 20 may both be in higher resistive states. In the fourth state, the current-voltage characteristic of the stack structure 180 may correspond to a fourth trend G4. The fourth state may correspond to datum (0, 0).

As described above, because the resistance change layers 10 and 20 having different switching voltages may be connected to the first and the second electrodes 190a and 190b in parallel in an example embodiment RRAM, multi-bit data may be recorded in a storage node S.

Contact areas between the electrodes 190a and 190b and the resistance change layers 10 and 20 and set and reset voltages of the resistance change layers 10 and 20 may change according to thicknesses of the first and the second resistance change layers 10 and 20. Therefore, characteristics of example embodiment RRAMs may be adjusted according to application needs by adjusting the thicknesses of the first and the second resistance change layers 10 and 20. For example, if the contact areas between the electrodes 190a and 190b and the resistance change layers 10 and 20 are reduced, the amount of off current may be reduced, and thus, power consumption may be reduced. A difference between the on current and the off current may be increased and thus, a sensing margin may be increased.

FIGS. 4A through 4H illustrate steps of an example method of manufacturing RRAMs.

Figure 4A:
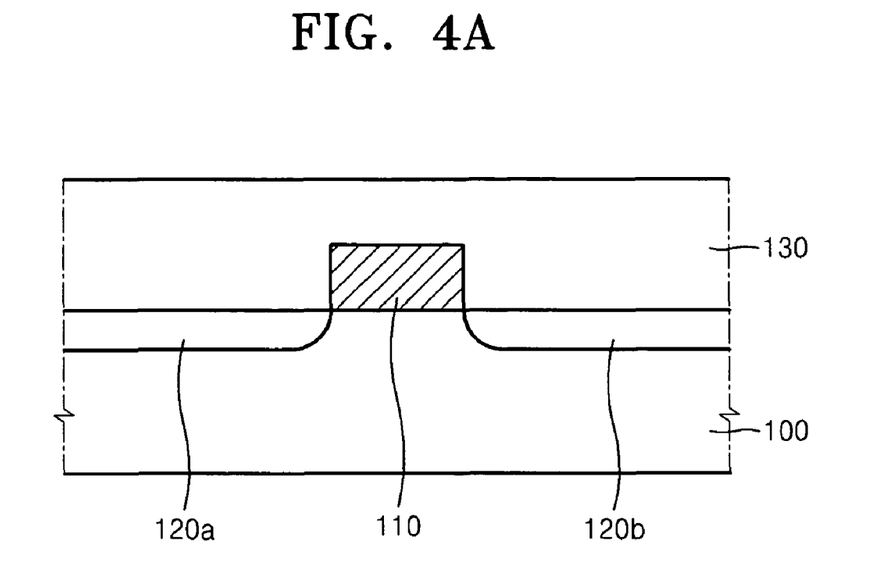
FIGS. 4A through 4H are cross-sectional views illustrating an example method of manufacturing resistive random access memory devices.

As shown in FIG. 4A, after a gate 110 may be formed on a substrate 100, first and second impurity regions 120a and 120b may be formed in the substrate 100 on both sides of the gate 110. Then, a first interlayer insulation layer 130 covering the gate 110 may be formed on the substrate 100.

Figure 4B:
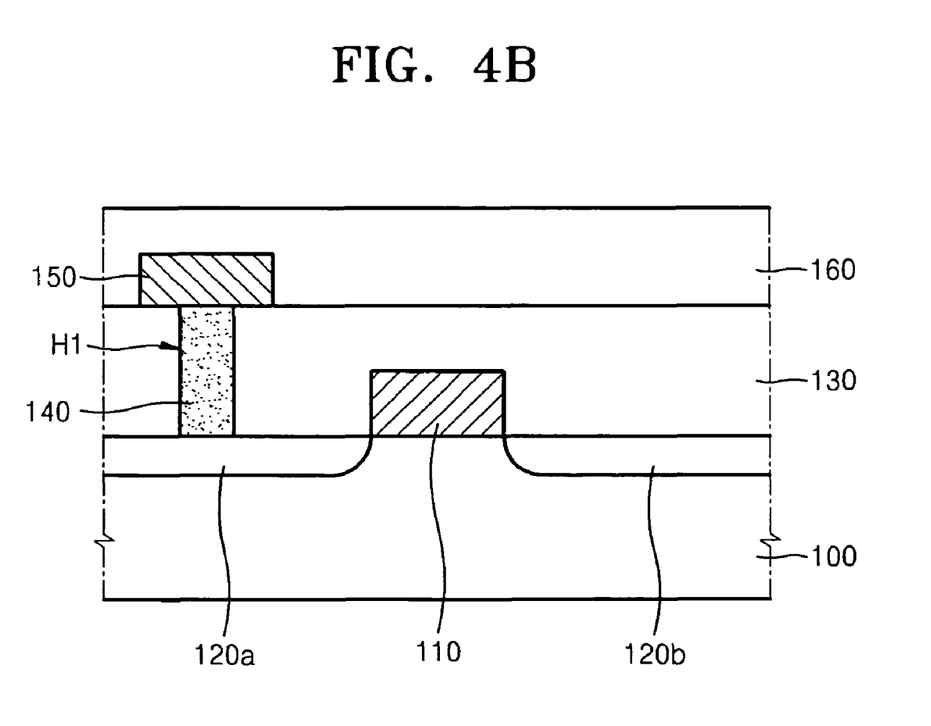

As shown in FIG. 4B, a first contact hole H1 may be formed by etching the first interlayer insulation layer 130 to expose the first impurity region 120a, and/or a first conductive plug 140 may be formed in the first contact hole H1. Then, a bit line 150 covering the exposed portion of the first conductive plug 140 may be formed on the first interlayer insulation layer 130, and/or a second interlayer insulation layer 160 may be formed on the first interlayer insulation layer 130 to cover the bit line 150.

Figure 4C:
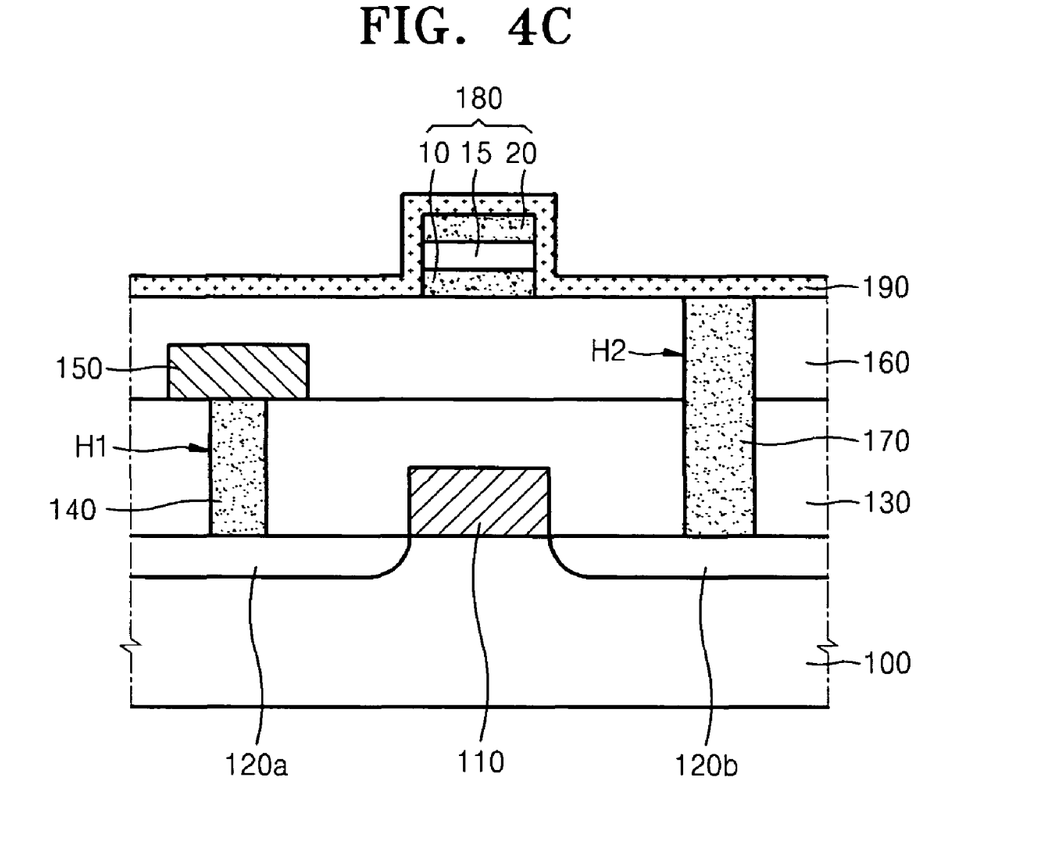

As shown in FIG. 4C, a second contact hole H2 may be formed by etching the second interlayer insulation layer 160 and/or the first interlayer insulation layer 130 to expose the second impurity region 120b, and/or a second conductive plug 170 may be formed in the second contact hole H2. A stack structure 180 may be formed on the second interlayer insulation layer 160 adjacent to the second conductive plug 170. The stack structure 180 may have a hexahedron shape and/or may include a first resistance change layer 10, an insulation layer 15, and/or a second resistance change layer 20, which may be sequentially deposited. The first resistance change layer 10 may be formed of, for example, $Cu_{2-x}S$, and the second resistance change layer 20 may be formed of Ge—Te.

An electrode layer 190 may be formed on the second insulation layer 160 and may cover the second conductive plug 170 and the stack structure 180.

Figure 4D:
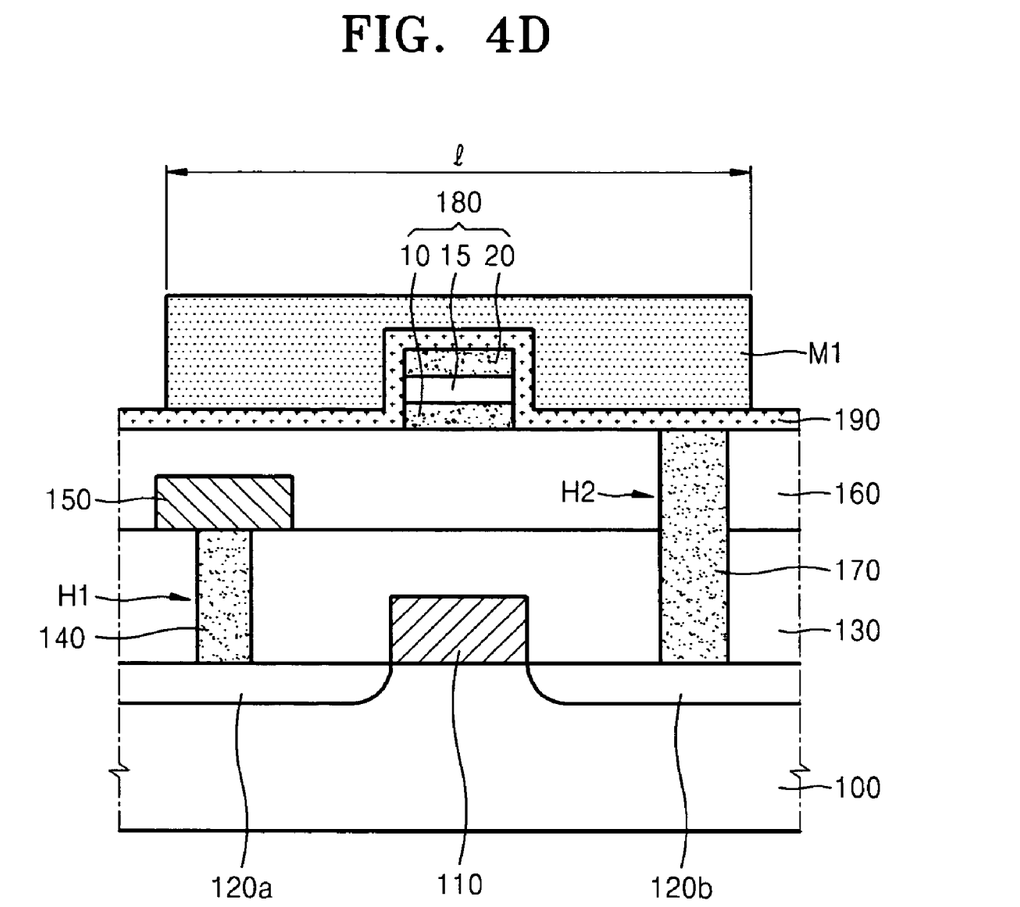

As shown in FIG. 4D, a mask layer M1 covering the stack structure 180 and extending to both sides of the stack structure 180 may be formed on the electrode layer 190, so as to cover the second conductive plug 170. The length l of the mask layer M1 may be greater than the length of the stack structure 180, and the width of the mask layer M1 may be less than that of the stack structure 180. The mask layer M1 may have a symmetrical structure surrounding the stack structure 180.

Figure 4E:
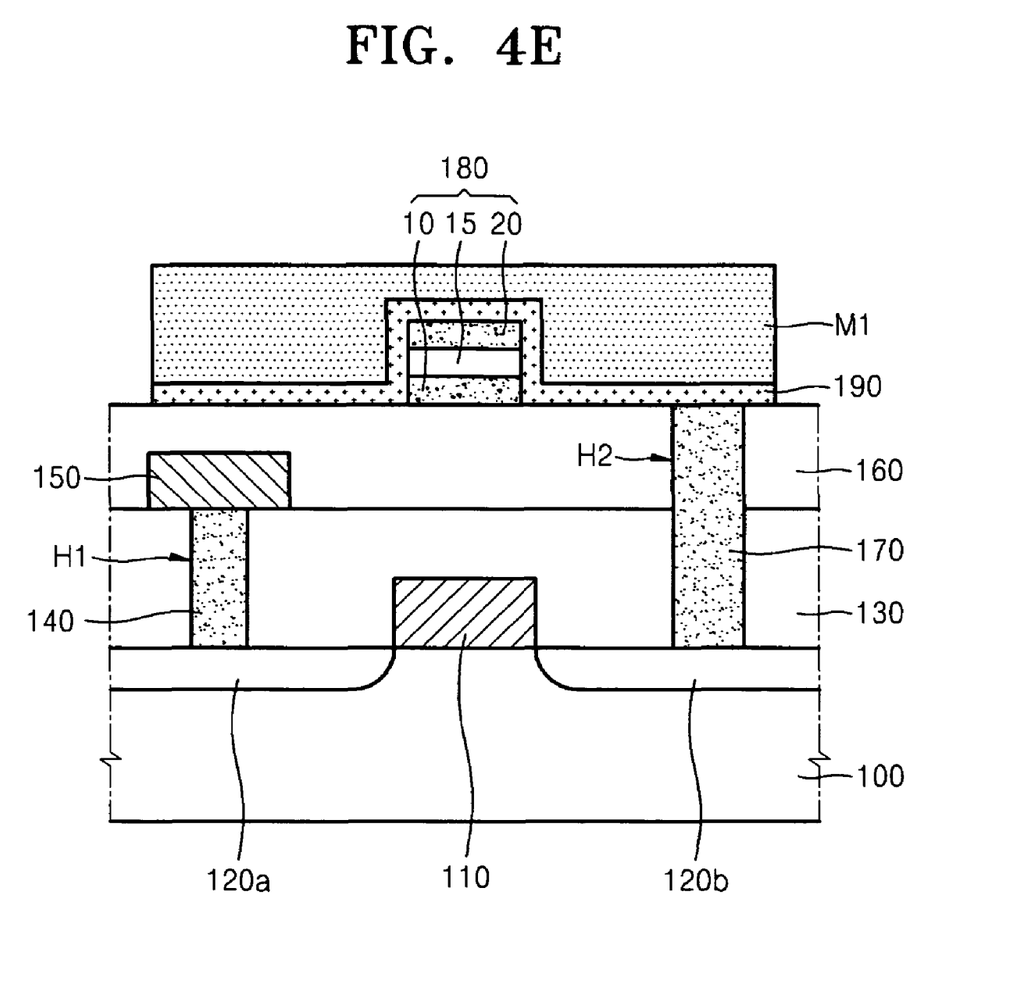

The electrode layer 190 may be etched using the mask layer M1 as an etch mask. During the etching of the electrode layer 190, a portion of the mask layer M1 may be etched. A state when the etching of the electrode layer 190 is completed is illustrated in FIG. 4E.

Figure 4F:
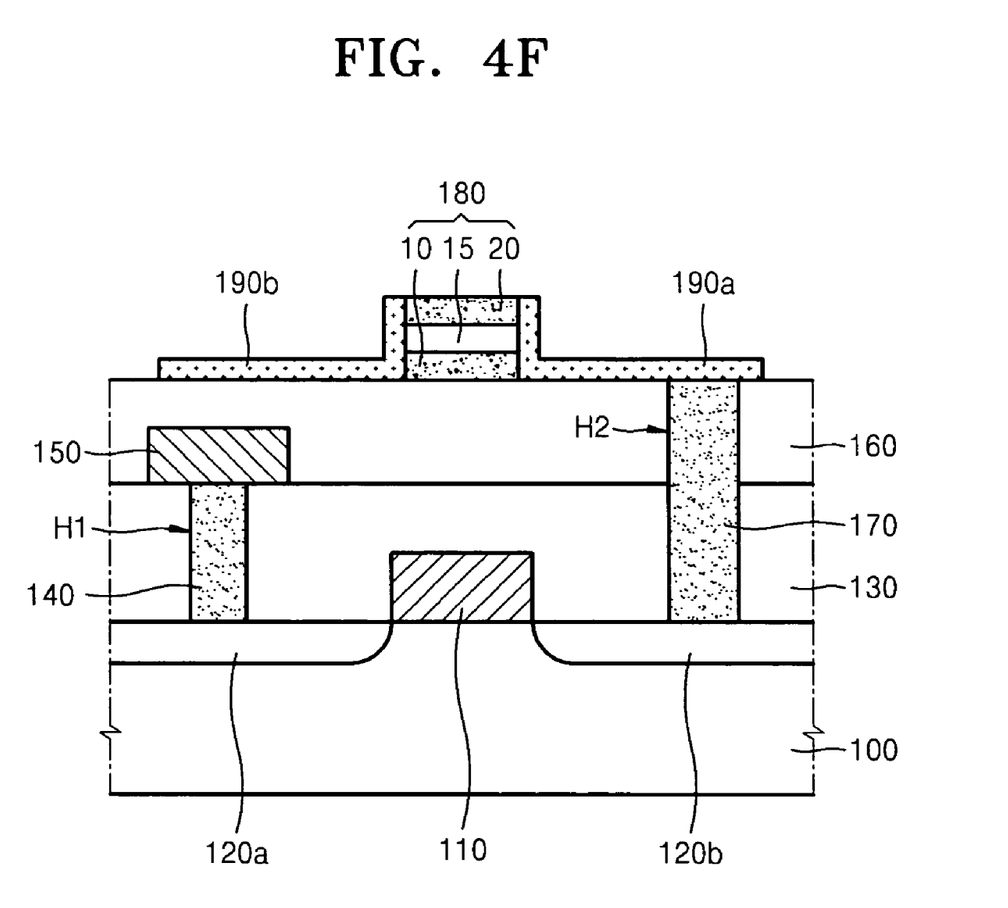

As shown in FIG. 4F, the mask layer M1 and the electrode layer 190 on the stack structure 180 may be removed by a chemical mechanical polishing (CMP) process. A first electrode 190a contacting the second conductive plug 170 may be formed on one side wall of the stack structure 180, and/or a second electrode 190b may be formed on the other side wall of the stack structure 180. The mask layer M1 remaining on both sides of the stack structure 180 may be removed by an ashing process and/or a wet etching process.

Figure 4G:
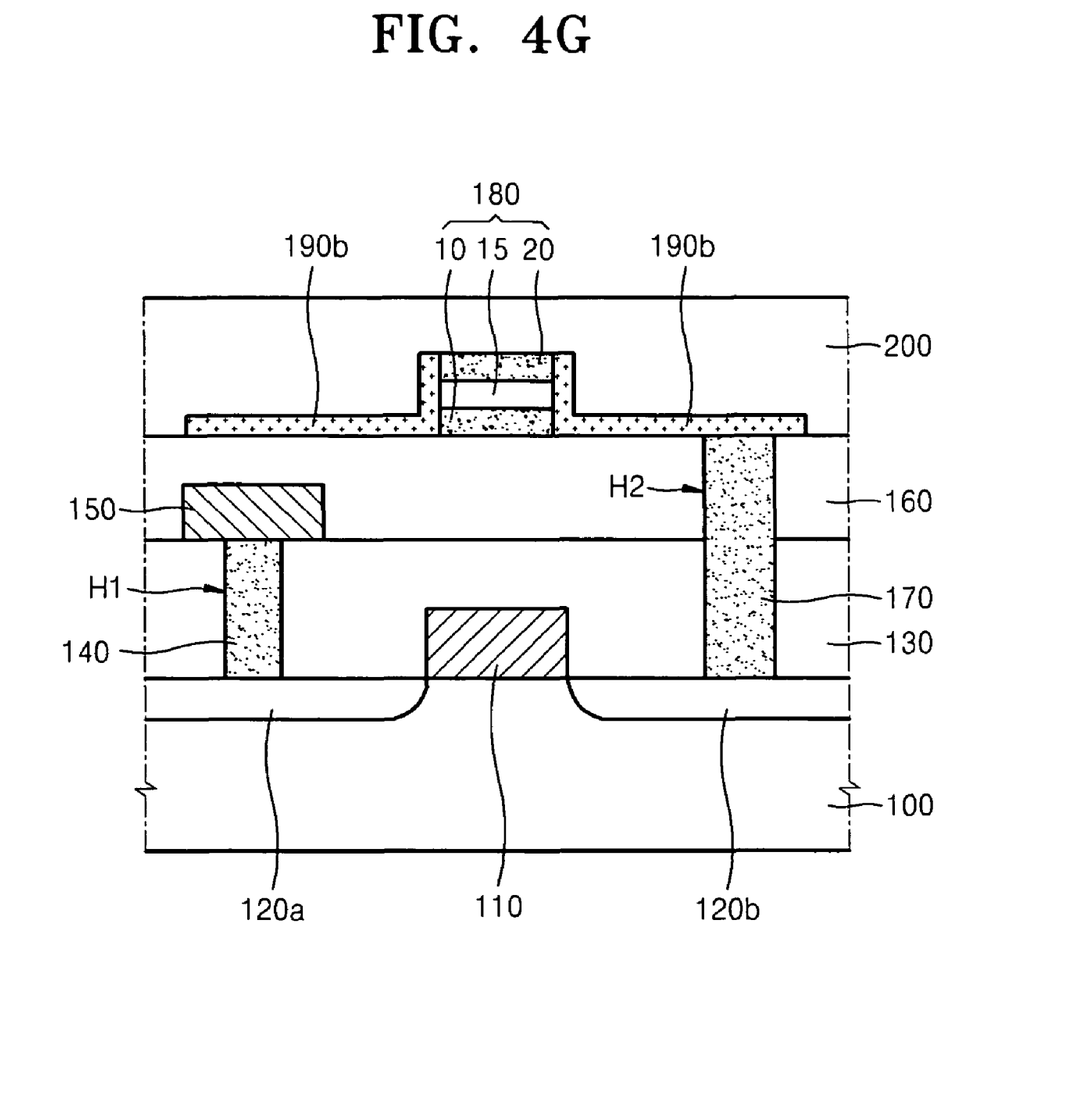

As shown in to FIG. 4G, a third interlayer insulation layer 200 may be formed on the second interlayer insulation layer 160, so as to cover the stack structure 180, the first electrode 190a, and/or the second electrode 190b.

Figure 4H:
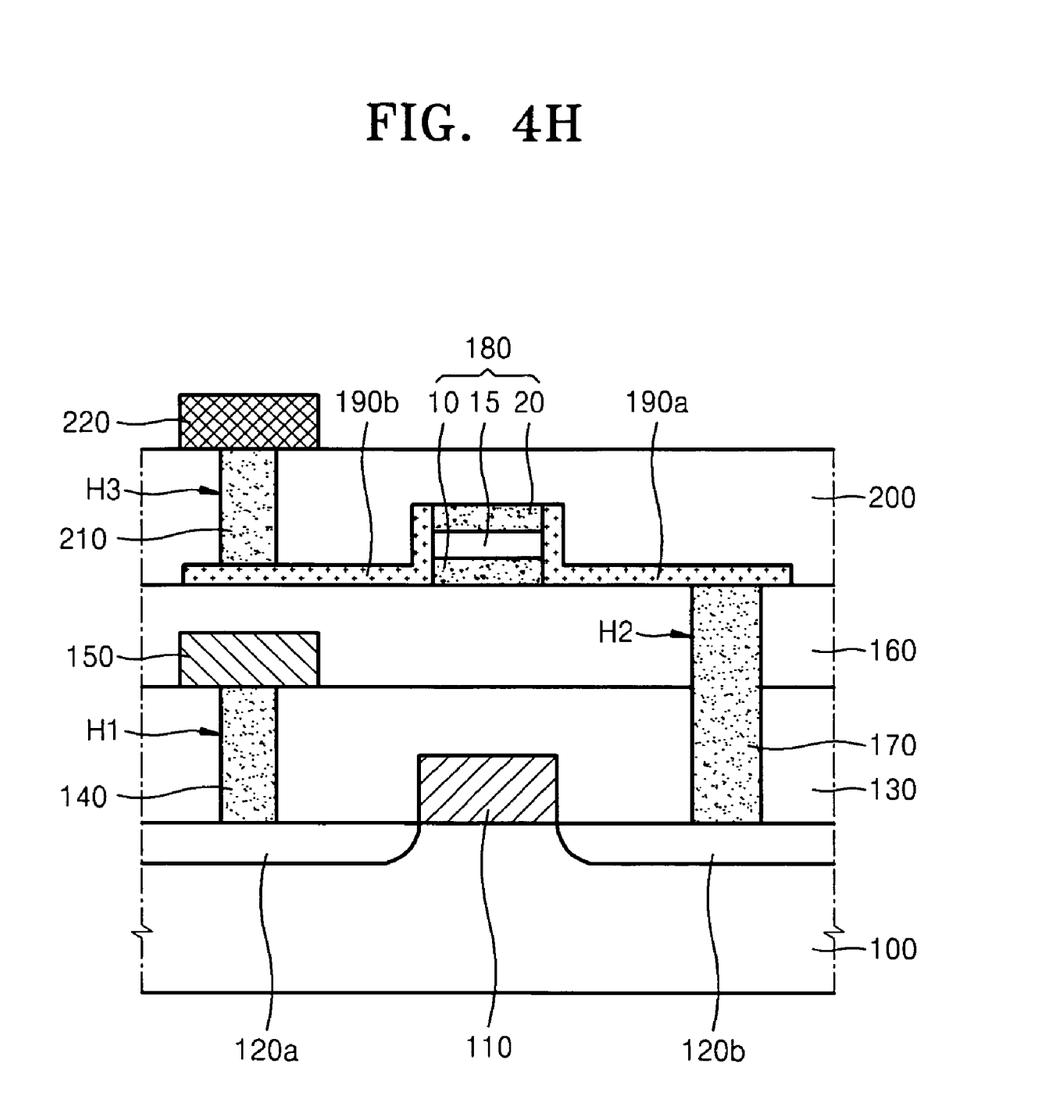

As shown in FIG. 4H, a third contact hole H3 may be formed by etching the third interlayer insulation layer 200 to expose a portion of the second electrode 190b, and a third conductive plug 210 may be formed in the third contact hole H3. A wiring 220 may be formed on the third interlayer insulation layer 200 to cover the exposed portion of the third conductive plug 210.

As described above, a storage node S in example embodiment RRAMs may have a structure in which a plurality of resistance change layers having different switching voltages may be connected to a first electrode and a second electrode in parallel. Multi-bit data may be recorded in the storage node S of example embodiment RRAMs, increasing the integration of the RRAM device.

Characteristics of example embodiment RRAMs may be adjusted by changing the thicknesses of the resistance change layers.

While example embodiments have been particularly shown and described with reference to attached drawings, it will be understood by one of ordinary skill in the art that various changes in form and details may be made therein without departing from the spirit and scope of the disclosure as defined by the following claims. For example, it may be understood by one of ordinary skill in the art that the stack structure 180 can have more than three resistance change layers and that switching devices having structures different from the transistor can be used.

What is claimed is:

1. A storage node for a resistive random access memory (RRAM) device, the storage node comprising:
    a stack structure including a plurality of resistance change layers, each resistance change layer being separated vertically from each other resistance change layer, each resistance change layer having a variable resistance, the variable resistance being set by a voltage applied to the resistance change layer;
    a first electrode on a first sidewall of the stack structure; and
    a second electrode on a second sidewall of the stack structure, wherein the resistance change layers are electrically connected in parallel between the first and the second electrodes.

2. The storage node of claim 1, wherein each resistance change layer of the plurality of resistance change layers has a unique switching voltage.

3. The storage node of claim 1, wherein the stack structure further includes an insulation layer between adjacent resistance change layers.

4. The storage node of claim 1, wherein one of the resistance change layers is a $Cu_{2-x}S$ layer.

5. The storage node of claim 1, wherein one of the resistance change layers is a Ge—Te layer.

6. The storage node of claim 1, wherein a first resistance change layer of the plurality of resistance change layers is a $Cu_{2-x}S$ layer and a second resistance change layer of the plurality of resistance change layers is a Ge—Te layer.

7. A resistive random access memory device comprising:
    the storage node of claim 1; and
    a switching device connected to the storage node.

* * * * *